United States Patent [19]

Kumahora et al.

[11] Patent Number: 4,803,356

[45] Date of Patent: Feb. 7, 1989

[54] METHOD AND APPARATUS FOR MEASURING DEGREE OF VACUUM IN AN ELECTRON MICROSCOPE

[75] Inventors: Hiroki Kumahora; Tsuneyuki Hashimoto, both of Hitachi; Eiichi Nishimura, Katsuta, all of Japan

[73] Assignee: Hitachi, Ltd., Tokyo, Japan

[21] Appl. No.: 70,549

[22] Filed: Jul. 7, 1987

[30] Foreign Application Priority Data

Jul. 7, 1986 [JP] Japan ................................ 61-157833

[51] Int. Cl.$^4$ ............................................. G21K 1/00
[52] U.S. Cl. ................................... 250/306; 250/307; 250/310; 250/311; 250/397
[58] Field of Search ............... 250/306, 307, 310, 311, 250/397

[56] References Cited

U.S. PATENT DOCUMENTS 4,587,433  5/1986  Farley ........................... 250/492.21

FOREIGN PATENT DOCUMENTS 60-157149  8/1985  Japan .

Primary Examiner—Bruce C. Anderson
Assistant Examiner—John A. Miller
Attorney, Agent, or Firm—Antonelli, Terry & Wands

[57] ABSTRACT

The present invention comprises disposing an electrode group consisting of an anode and cathodes provided on both sides of the anode at a portion where the degree of vacuum in an electron microscope is to be measured closing in thermal electrons between the electrode group and a magnetic field forming lens systems such as objective lens system, condenser lens system and the like of the electron microscope, collecting a gas ionized by the thermal electrons closed therebetween to measure an ionic current, thereby realizing measurement of a degree of vacuum on a sample specimen part or thereabout without deteriorating a performance of the electrons microscope. For generating the thermal electron, for example, an observing electron beam of the electron microscope is collided with cathodes of the electrode group. For measuring the degree of vacuum on the sample specimen part of thereabout, the anode is disposed between an objective lens pole piece and a sample specimen holder stage and the objective lens pole piece and the sample specimen holder stage are used as cathodes so that the degree of vacuum can simply be measured thereby.

10 Claims, 4 Drawing Sheets

METHOD AND APPARATUS FOR MEASURING DEGREE OF VACUUM IN AN ELECTRON MICROSCOPE

BACKGROUND OF THE INVENTION

The present invention relates to a method and apparatus for measuring degree of vacuum in an electron microscope, and is particularly concerned with a method and apparatus for measuring degree of vacuum in an electron microscope which are preferable for measuring degree of vacuum of a sample part.

In an electron microscope, the degree of vacuum in a body must be measured at all times for efficient monitoring of operation of an electron gun and for obtaining high resolution. A conventional measuring apparatus for degree of vacuum is installed for the purpose of measuring a general degree of vacuum in the body, and as shown in FIG. 7, a measuring apparatus for degree of vacuum 14 is installed at the position of a pipe drawn out of a body 1, thereby measuring a general degree of vacuum in the body. A reference numeral 13 represents a vacuum pump.

A working principle of the conventional measuring apparatus for degree of vacuum is shown in FIG. 8 (reference being made to "Vacuum Art", Lectures on Experimental Physics 4, Kyoritsu Shuppan). The conventional apparatus comprises an anode 15, a magnet 16, two cathodes 17, a high voltage supply 18, and a microbeam ammeter 19. A volume of thermal electrons is generated on a high voltage impressed by the high voltage supply 18. The thermal electrons collide with a neutral gas (gas before ionized) in a space between the two cathodes 17, and a further volume of thermal electrons is generated thereby. The thermal electrons are closed in the space between the two cathodes 17 by a potential arising from the anode 15 and a field arising from the magnet 16. The neutral gas incident externally is ionized by the thermal electrons closed in as above. Since a mass of the ionized gas is sufficiently heavy as compared with the thermal electrons, it reaches the cathodes without being influenced by the potential and magnetic field in the space between the two cathodes 17. Consequently, a degree of vacuum can be decided by measuring an ionic current on the microbeam ammeter. Relation between a degree of vacuum P and an ionic current I may be given by:

$$I = cP^k \quad (k = 1 \text{ to } 2) \quad (c \text{ being constant})$$

The conventional measuring apparatus for degree of vacuum is characteristic of requiring the high voltage supply 18 for generating the thermal electrons and the magnet 16 for closing in the thermal electrons.

Then, the measuring apparatus of this kind comes in those which are disclosed in Japanese Patent Laid-Open No. 66330/1982, Japanese Patent Laid-Open No. 66331/1982 and others.

Meanwhile, it has been considered that a deterioration of degree of vacuum is caused mainly by the gas discharged from a sample specimen. Accordingly, it is conceivable that a measuring apparatus for degree of vacuum be utilized positively as a means for obtaining information on a surface condition of the sample specimen in line with observation on an electron microscope. However, a general degree of vacuum in the body only is measured, as mentioned above, on a conventional electron microscope, and hence there has been no such case where the degree of vacuum of a sample specimen part or thereabout is measured directly. That is, in a measurement of the degree of vacuum on the conventional measuring apparatus for the electron microscope, the situation is such that a pressure of the gas discharged from all parts in the body is measured, but the degree of vacuum only of the sample specimen part is not measured precisely. Further, the degree of vacuum varies according to area as an exhaust resistance depends on structure within the body, or particularly on diameter and length of the piping. Accordingly, the problem is that a correction must be performed in consideration of the structure within the body before obtaining a degree of vacuum of the sample specimen part precisely.

Then, in case the conventional measuring apparatus shown in FIG. 8 is installed in the body of an electron microscope, the high voltage supply 18 for generating thermal electrons and the magnet 16 for closing in the thermal electrons must be provided, therefore an extra high voltage and magnetic field are applied in the body. Particularly, the magnetic field for closing in the thermal electrons must have a strength almost as strong as a magnetic field of the electron microscope body, and thus it is forecasted that a performance of the electron microscope may sharply drop to cause disturbance of an image, deterioration of a resolution and the like from installing the conventional measuring apparatus for degree of vacuum in the body.

Then, for the requirement of discharge prevention, there is a limit for narrowing the space between the anode 15 and the cathodes 17, thus involving a difficulty of miniaturization of the apparatus as a whole. Consequently, the conventional measuring apparatus for degree of vacuum cannot be installed on the sample specimen part within the body, and hence a degree of vacuum of the sample specimen part or thereabout cannot be measured directly.

SUMMARY OF THE INVENTION

An object of the invention is to realize a measurement of degree of vacuum within an electron microscope or particularly on a sample specimen parts or thereabout without deteriorating a performance of the electron microscope.

The above object is then attained by a construction wherein an electrode group consisting of an anode and cathodes provided on both sides of the anode is disposed at a portion where to measure degree of vacuum within an electron microscope, thermal electrons are closed between the electrode group by the electrode group and a magnetic field forming a lens system of the electron microscope, a gas ionized by the closed-in thermal electron is collected to measure an ionic current.

In the electron microscope, there exists a magnetic field for constituting an objective lens system and a focusing lens system. Accordingly, a disposition of the electrode group at a portion for measuring degree of vacuum in the electron microscope is effective in closing in the thermal electron for measuring degree of vacuum by the electrode group and the magnetic field of the electron microscope. From collecting and measuring a gas ionized by the thermal electron, a local degree of vacuum on a sample specimen part or thereabout within the electron microscope can be measured without deteriorating a performance of the electron microscope. That is, a quantity of the ionized gas is measured as an ionic current on a microbeam ammeter or other means, and since the ionic current and the gas pressure can be expressed by a fixed rule, a pressure on the sample specimen part or thereabout, namely degree of vacuum can be measured.

Thermal electrons can be generated by impressing a high voltage on the electrode group, however, the degree of vacuum can be measured easily without deteriorating a performance of the electron microscope by generating thermal electrons by colliding an observing electron beam of the electron microscope with the cathodes of the electrode group.

Further, for measuring degree of vacuum on the sample specimen part or thereabout, an objective lens pole piece and a sample specimen holder stage are used as cathodes, the anode is disposed between the objective lens pole piece and the sample specimen holder stage to constitute the electrode group, then a quantity of the gas ionized after discharge from the sample specimen can be measured, therefore the degree of vacuum on the sample specimen part or thereabout can be measured easily without deteriorating a performance of the electron microscope.

DESCRIPTION OF THE PREFERRED EMBODIMENTS

Embodiments of the invention will now be described in detail with reference to the accompanying drawings.

Figure 2:
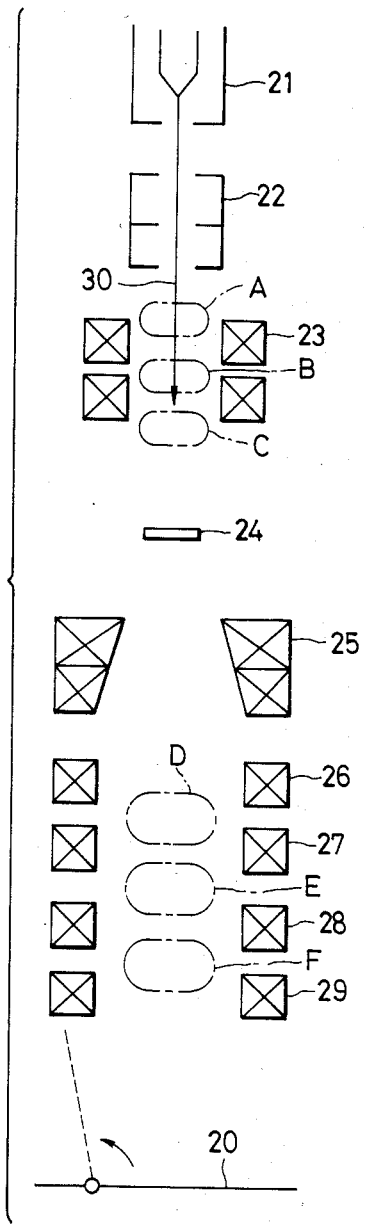
FIG. 2 is a schematic representation of an electron microscope to which the invention is applied.

FIG. 2 shows an outline of one example of construction of an electron microscope to which the invention is applied. The electron microscope of FIG. 2 is a transmissive type, comprising an irradiation system for irradiating an electron beam 30 to a sample specimen 24, and an imaging system for magnifying the electron beam 30 having passed through a sample specimen and imaging it on a fluorescent plate 20 (imaging plane). The irradiation system comprises an electron gun 21, an accelerating tube 22, a coil 23 forming a condenser lens and others. The imaging system comprises a coil 25 forming an objective lens, coils 26, 27 forming an intermediate lens, coils 28, 29 forming a projection lens and others. The condenser lens of the irradiation system functions as condensing the electron beam into a parallel beam, the objective lens of the imaging system functions as deciding a focal length, and the intermediate lens and the projection lens function as deciding a magnification of the image. Since these lenses are formed by a magnetic field produced by the coils, a strong magnetic field is generated in the neighborhood of the lenses. The invention then utilizes the magnetic field.

Figure 3:
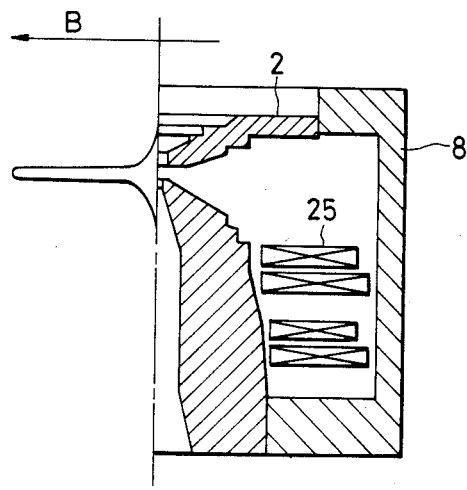
FIG. 3 is a view showing a section of an objective lens pole piece and a magnetic field distribution at a sample specimen position and thereabout.

The case where degree of vacuum of the sample specimen part in an electron microscope is measured will be described hereunder. A measuring apparatus for degree of vacuum of the sample specimen part is shown in detail in FIG. 1. There is formed a gap between an upper portion and a lower portion of the objective lens pole piece 2. While not so indicated, an objective lens stop and others are inserted actually in the gap. A sample specimen holder stage 5 for holding a sample specimen is disposed across the electron microscope tube 1 therein through a vacuum seal so as to keep the axis orthogonal to a course of the electron beam 30. As shown in FIG. 3, the coil 25 generating a magnetic field for lens formation is wound on the outside of the objective lens pole piece 2, thus generating a strong magnetic field B at a sample position between the upper portion and the lower portion of the pole piece 2. Then, a reference numeral 8 represents a tube side of the electron microscope. The measuring apparatus for degree of vacuum in the embodiment has a construction with an anode 3 added within a conventional transmissive type electron microscope. That is, the measuring apparatus for degree of vacuum comprises the anode 3, an insulator 4 for insulating the anode 3 from the electron microscope tube 1, the objective lens pole piece 2 and the sample specimen holder stage 5 working as cathodes, an ion collecting power source 6, a microbeam ammeter 7 for measuring ionic current. The ion collecting power source 6 is a 50-to-200 V constant voltage supply, and the microbeam ammeter 7 uses a microammeter. The objective lens pole piece 2 and the sample specimen holder stage 5 working as cathodes are grounded at a body portion together with the ion collecting power source 6. The anode 3 is insulated from the body by the insulator 4 and supplied with a voltage from a plus terminal of the ion collecting power source 6. Consequently, a voltage is impressed between the anode 3 and the objective lens pole piece 2 and the sample specimen holder stage 5 working as cathodes.

Next, the terms will be defined before going into a working principle of the apparatus.

An electron cloud forming system refers to a system for forming a thick layer of electrons for ionizing a neutral gas of the object of measurement. The electron cloud forming system comprises a generating device of voltage and magnetic field for closing in the thermal electrons produced by collision of the electron beam. A voltage is impressed from an external supply on the anode provided at a coaxial position with the electron beam in the body and the cathodes paired vertically of the anode. The magnetic field utilizes a field of the electron microscope body (for example, a magnetic field forming an objective lens or a condenser lens).

Then, an ionic current measuring system refers to a system for collecting an ionized gas and measuring an ionic current. The ionic current measuring system comprises a generating device of ion collecting voltage and a measuring device of ionic current. The generating device of ion collecting voltage is constituted of the same anode, cathodes and external supply as the electron cloud forming system. The measuring device of ionic current uses a microcurrent measuring device.

Figure 1:
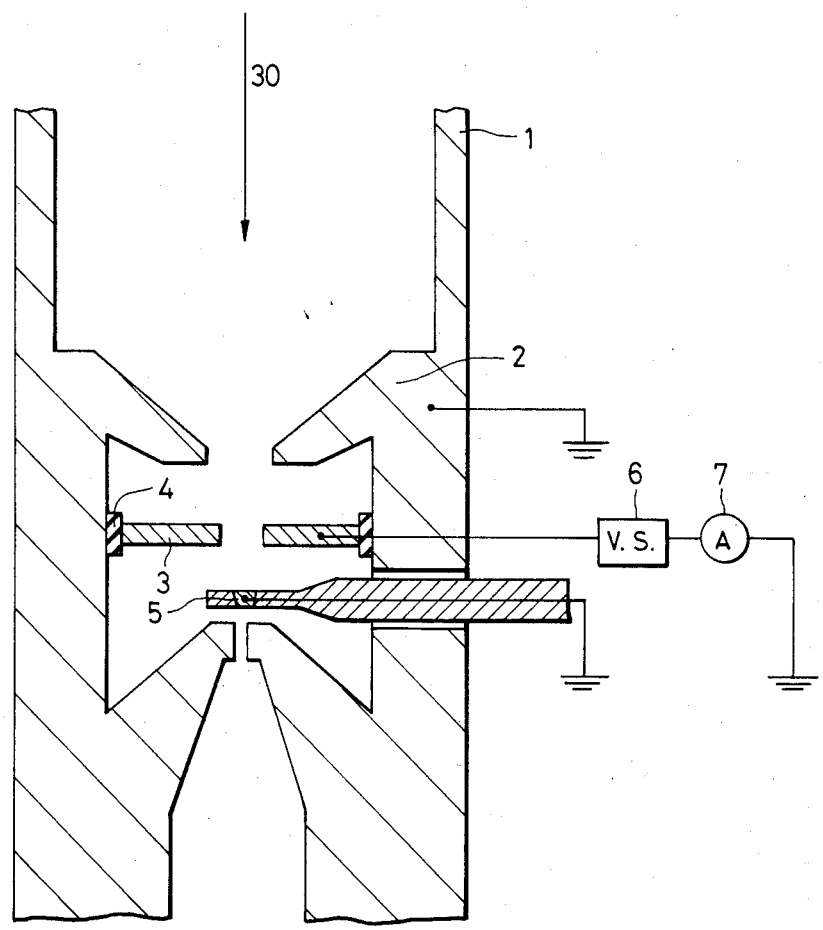
FIG. 1 is a longitudinal sectional view outlining one preferred embodiment in which the invention is applied for measuring degree of vacuum of a sample specimen part.

A working principle of the apparatus will now be described with reference to FIG. 1.

The electron beam accelerated up to about 200 kV by the electron microscope body collides with the sample specimen holder stage 5 and thus emits a volume of secondary electrons to a domain of the electron cloud.

In the electron cloud forming system, the secondary electrons collide with the neutral gas and generate further a volume of thermal electrons. In the electron cloud forming system, the thermal electrons are then closed in a space between the sample specimen holder stage 5 and the objective lens pole piece 2 by a potential between the anode and the cathodes. Thus in the electron cloud forming system, there exists the space with thick electrons. A neutral gas of the object of measurement is ionized in the electron cloud forming system. The ionized gas is sufficiently heavy in mass as compared with the thermal electrons and hence is led to the cathodes by the ionic current measuring system without being influenced by magnetic field and potential, and then the current is measured. In this case, the ionic current I and the gas pressure P are correlated as:

$$I = c \cdot P^k \text{ (k=1 to 2) (c being constant)}$$

therefore a degree of vacuum on the sample specimen part or thereabout is ready for measurement. In the embodiment where an ion collecting voltage is 200 V, the ionic current I is obtainable at 0.1 μA to 1 μA at the degree of vacuum $P - 10^{-7}$ to $10^{-6}$ torr. In the embodiment, a high voltage supply and a magnet is not particularly required for the apparatus and a miniaturization can easily be attained therefore as compared with the conventional apparatus, and a further advantage is that it can be installed in the neighborhood of the sample specimen part.

Next taken up is a possible influence on an electron microscope image which may be exerted by the anode installed within the electron microscope.

In the case of a magnetic field lens with high magnification like an electron microscope, an image aberration D will be given:

$$D = G \cdot A \left( \frac{v}{V} + \frac{2j}{J} \right)$$

("Electron Microscope" p82, Lectures on Experimental Physics 23, Kyoritsu Shuppan). Here, G denotes a spherical aberration coefficient. A denotes an angle of deviation of electron beam from an orbit, V denotes a voltage applied on the anode of the apparatus, J and j denote a set point of the magnetic field lens and a controlling current value.

In the embodiment, assuming the anode voltage v=200 V and the electron microscope acceleration voltage v=200 kV, then, $$\frac{v}{V} = 10^{-3}.$$

On the other hand, 2j/J can be adjusted to 0 to 0.1 nm correspondingly to the extensive acceleration voltage (0 to 200 kV) of the electron microscope, which is a sufficient range of adjustment against a voltage fluctuation of 200 V or so. Accordingly, an influence on the electron microscope image due to installation of the anode can perfectly be corrected.

In the embodiment, the objective lens pole piece 2 and the sample holder stage 5 are used as cathodes, however, it is apparent that a similar effect will be obtainable from installing other cathodes than the abovedescribed structure. Further, other anode and cathodes than the electron cloud forming system may be used for ion collection.

Figure 4:
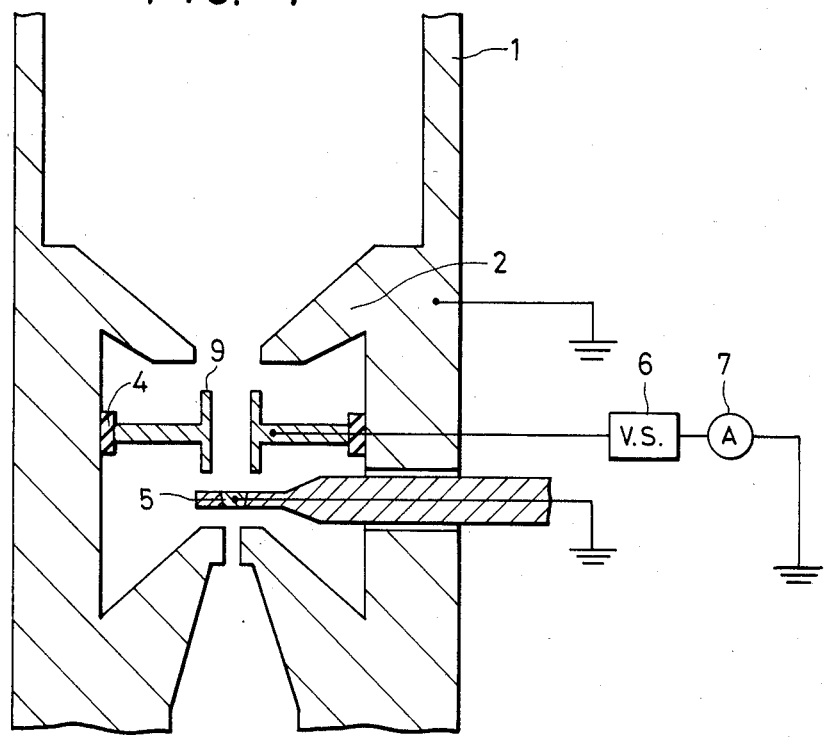
FIG. 4 to FIG. 6 are longitudinal sectional views of main parts representing variants of the invention each.
Figure 5:
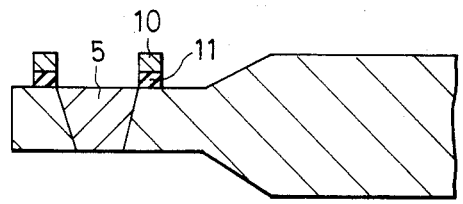
Figure 6:
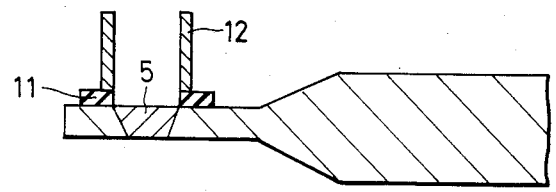
Figure 7:
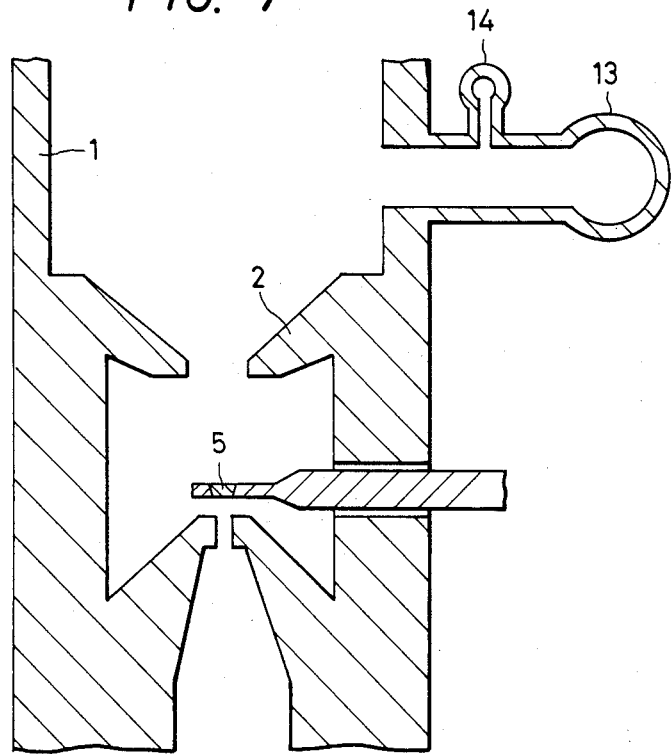
FIG. 7 is a longitudinal sectional view showing a part of the construction of a conventional electron microscope and a position for measuring degree of vacuum.
Figure 8:
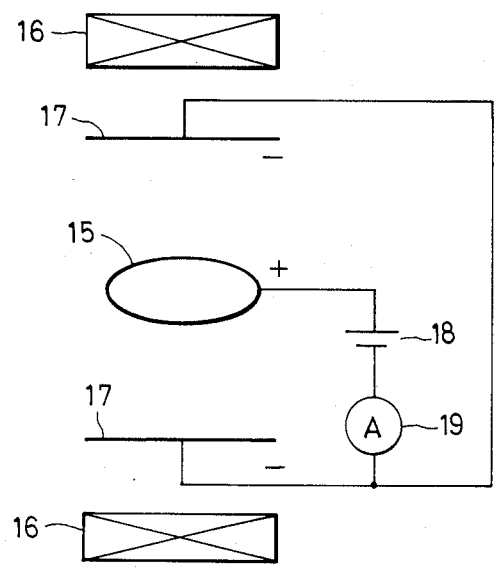
FIG. 8 is a diagram showing one example of a principle on conventional measurement of degree of vacuum.

Next, other variants of the invention will be represented in FIG. 4 to FIG. 6. FIG. 4 is that for which the anode of the electron cloud forming system is charged to a cylindrical anode 9. Nothing if different basically from the above-described embodiment. However, an advantage is that S/N ratio and stability of the measurement are enhanced by increased of a thick space of the electrons and increase of a stability of the electron cloud. The electron cloud forming system using the cylindrical anode like the variant is called a cylindrical electron cloud forming system.

FIG. 5 indicates an electron cloud forming system comprising the sample specimen holder stage 5, an anode 10 and an insulator 11. In the variant, the objective lens pole piece and the sample specimen holder stage 5 of the electron microscope body are used as cathodes of the electron cloud forming system. The insulator 11 is that of coming between the anode 10 and the sample specimen holder stage 5. In the variant, a principle of the measurement of degree of vacuum on the sample specimen part does not change basically, however, the electron microscope body need not be rebuilt from installing the anode 10 on the sample specimen holder stage side, and an advantage is that maintenance is easy. The electron cloud forming system with the anode installed on the sample specimen holder like the variant is called a sample specimen holder type electron cloud forming system. Then, the sample specimen holder having the sample specimen holder type electron cloud forming system is called a sample specimen holder with function of measuring degree of vacuum of a sample part.

FIG. 6 shows a variant of the sample specimen holder type electron cloud forming system comprising the sample specimen holder stage 5, a cylindrical anode 12, and the insulator 11. The variant is that for which the anode of the variant of FIG. 5 is changed to a cylindrical type, having an advantage of the cylindrical electron cloud forming system of FIG. 4 in addition to that of the sample specimen holder type electron cloud forming system.

In the foregoing embodiment, the apparatus is installed only in the neighborhood of the sample specimen part, however, the measuring apparatus according to the invention may be installed at plural positions within the body of the electron microscope, thereby measuring a degree of vacuum on each part in the body. In this case, however, degree of vacuum at a plurality of areas in the body depends on stability and shape of the electron beam in the electron microscope (a gas ionizing efficiency varying according to a shape of the electron beam), therefore the apparatus of the invention will be installed at plural portions selected from among the positions indicated by A, B, C, D, E, F in FIG. 2, thereby forming a noncontact monitor of the electron beam 30. Then, the cathodes of the measuring apparatus installed other than the sample specimen part remain same as the foregoing embodiment except that another pair of cathodes than the objective lens pole piece and the sample specimen holder stage are provided.

According to the invention, an electrode group consisting of an anode and cathodes provided on both sides of the anode is disposed at a portion where to measure degree of vacuum on a sample specimen part and others in an electron microscope, thus thermal electrons for measuring degree of vacuum are closed in by the electrode group and a magnetic field of the electrons microscope, a gas ionized by the thermal electron is collected and then measured to obtain a degree of vacuum, therefore a local degree of vacuum on the sample specimen part of thereabout within the electron microscope can be measured without deteriorating a performance of the electron microscope. Accordingly, the degree of vacuum on the sample specimen part or thereabout can effectively be measured up to $10^{-6}$ to $10^{-7}$ torr, which is unrealizable in the conventional electron microscope.

What is claimed is:

1. A measuring method for degree of vacuum in an electron microscope, wherein an electrode group consisting of an anode and cathodes provided on both sides of the anode is disposed at a portion where the degree of vacuum in the electron microscope is to be measured, comprising the steps of generating thermal electrons by colliding an electron beam with said cathodes, closing in the thermal electrons between said electrode group utilizing a magnetic field forming a lens system of said electron microscope, collecting a gas ionized by the thermal electrons closed therebetween and measuring an ionic current so as to obtain the degree of vacuum.

2. The measuring method for degree of vacuum in an electron microscope as defined in claim 1, wherein said electron beam is an observing electron beam of the electron microscope.

3. The measuring method for degree of vacuum in an electron microscope as defined in claim 2, further comprising the steps of disposing the anode between an objective lens pole piece and a sample specimen holder stage, and using said objective lens pole piece and sample specimen holder stage as the cathodes of said electrode group.

4. A measuring apparatus for degree of vacuum in an electron microscope, comprising an anode disposed at a portion where the degree of vacuum in the electron microscope is to be measured and cathodes provided on both sides of the anode, and means for generating thermal electrons by colliding an electron beam with said cathodes, means for collecting a gas ionized by said thermal electrons present between said anode and cathodes and for measuring an ionic current.

5. The measuring apparatus for degree of vacuum in an electron microscope as defined in claim 4, said electron beam is an observing electron beam of the electron microscope.

6. The measuring apparatus for degree of vacuum in an electron microscope as defined in claim 5, wherein said electrode group is installed at plural positions along a course of the electron beam so as to monitor the electron beam.

7. The measuring apparatus for degree of vacuum in an electron microscope as defined in claim 4, wherein said anode is structured cylindrically, said cathodes being installed at both ends of the cylinder.

8. An electron microscope comprising an electrode group of cathodes including an objective lens pole piece and a sample specimen holder stage of the electron microscope and an anode provided between said cathodes, and means for collecting a gas ionized by thermal electrons generated from colliding an observing electron beam of the electron microscope with said cathodes and thus present between said anode and cathodes and for measuring an ionic current.

9. The electron microscope as defined in claim 8, wherein the sample holder and the anode are unified in structure through an insulator.

10. The electron microscope as defined in claim 8, wherein said anode is structured cylindrically, said cathodes being installed at both ends of the cylinder.

* * * * *